(12) United States Patent
Arsovski et al.

(10) Patent No.: US 7,940,581 B2
(45) Date of Patent: May 10, 2011

(54) METHOD FOR LOW POWER SENSING IN A MULTI-PORT SRAM USING PRE-DISCHARGED BIT LINES

(75) Inventors: Igor Arsovski, Williston, VT (US); Michael T. Fragano, Essex Junction, VT (US); Robert M. Houle, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/861,026

(22) Filed: Aug. 23, 2010

(65) Prior Publication Data

US 2010/0315894 A1    Dec. 16, 2010

Related U.S. Application Data

(62) Division of application No. 12/135,229, filed on Jun. 9, 2008, now Pat. No. 7,859,921.

(51) Int. Cl.
    *G11C 7/06* (2006.01)
(52) U.S. Cl. ............... 365/189.15; 365/204; 365/203; 365/230.05; 365/227; 365/208; 365/190; 365/156; 365/154
(58) Field of Classification Search .............. 365/204, 365/203, 230.05, 227, 189.05, 208, 207, 365/205, 190, 156, 154
    See application file for complete search history.

(56) References Cited

U.S. PATENT DOCUMENTS

| | | | |
|---|---|---|---|
| 4,413,330 A * | 11/1983 | Chao et al. | 365/205 |
| 4,656,361 A | 4/1987 | McIntyre | |
| 6,262,912 B1 | 7/2001 | Sywyk et al. | |
| 7,161,868 B2 | 1/2007 | Morishima | |
| 7,272,061 B2 | 9/2007 | Saleh | |
| 7,345,936 B2 * | 3/2008 | Notani | 365/203 |
| 2002/0172076 A1 | 11/2002 | Marotta et al. | |
| 2004/0243758 A1 | 12/2004 | Notani | |
| 2007/0263435 A1 | 11/2007 | Nii | |

* cited by examiner

*Primary Examiner* — Andrew Q Tran
(74) *Attorney, Agent, or Firm* — Cantor Colburn LLP; Michael LeStrange

(57) ABSTRACT

A method for sensing the contents of a memory cell within a static random access memory (SRAM) includes holding a bit line associated with the memory cell at a zero voltage potential when the memory cell is not being accessed; energizing the bit line to a first voltage potential different than the zero voltage potential during an access of the memory cell; and sensing the memory cell contents when the associated bit line has reached the first voltage potential.

10 Claims, 3 Drawing Sheets

METHOD FOR LOW POWER SENSING IN A MULTI-PORT SRAM USING PRE-DISCHARGED BIT LINES

CROSS-REFERENCE TO RELATED APPLICATION

This application is a divisional of U.S. patent application Ser. No. 12/135,229, filed Jun. 9, 2008, the disclosure of which is incorporated by reference herein its entirety.

BACKGROUND

The present invention relates generally to memory devices and, more particularly, to an apparatus and method for low power sensing in a multi-port SRAM using pre-discharged bit lines.

A typical static random access memory (SRAM) cell includes an array (rows, columns) of individual SRAM cells. Each SRAM cell is capable of storing a voltage value therein, which voltage value represents a corresponding binary logical data bit value (e.g., a "low" or "0" value, and a "high" or "1" value). One existing configuration for an SRAM cell includes a pair of cross-coupled devices such as inverters. Using CMOS (complementary metal oxide semiconductor) technology, each inverter comprises a pull-up PFET (p-channel) transistor connected to a complementary pull-down NFET (n-channel) transistor, with the two transistors in each inverter typically connected in series between a positive voltage potential and ground. The inverters, further connected in a cross-coupled configuration, act as a bistable latch that stores the data bit therein so long as power is supplied to the memory array.

The transistors within the typical SRAM cell exhibit relatively significant current leakage, particularly at the word-line transistor gates and the bit-line transistor gates. Since known SRAM cell designs require a constant power level both to maintain the data bit stored in the SRAM latch and to allow the reading from and the writing to of data, the current leakage increases the power used by the array of SRAM cells. For example, one common technique is to continuously pre-charge all of the read bit lines within the SRAM to a logical high level; that is, to a positive voltage of, e.g., +1 volts. This is done when the bit lines are not being accessed. After a read cycle involving certain read bit lines, those bit lines are returned to their pre-charge state. The resulting undesirable use of power in these prior art designs increases with the increase in SRAM cell density and the overall number of cells on an integrated circuit (IC), such as a stand-alone memory device, or as part of a processor or application-specific integrated circuit (ASIC).

Various techniques to reduce the leakage current have been proposed, such as increasing the size of the cell by making the devices longer, increasing the threshold voltages of the cell, adding additional transistors to the cell, or lowering the voltage to the array when the cell is not being accessed. However, all of these techniques can increase the area of the array, or significantly reduce the performance of the array.

What is needed is an apparatus and method to reduce the DC power consumption in a multi-port SRAM cell due to relatively large cell current leakage as well as to reduce the AC power consumption in the multi-port SRAM cell due to relatively large read bit line voltage swings.

SUMMARY

The foregoing discussed drawbacks and deficiencies of the prior art are overcome or alleviated, in an exemplary embodiment, by an apparatus for low power sensing in a multi-port SRAM using pre-discharged bit lines. In an exemplary embodiment, the apparatus includes a first switch that holds a bit line associated with the memory cell at a zero volt potential when the memory cell is not being accessed; a second switch that holds a sense line at a first voltage potential for a period of time after access to the memory cell has been allowed, wherein the sense line is connected to the bit line when the memory cell is being accessed, and wherein the bit line is energized to a second voltage potential different than the first voltage potential when the memory cell is being accessed; and a sense amplifier that senses the second voltage potential on the bit line when the memory cell is being accessed.

In another exemplary embodiment, a method for low power sensing in a multi-port SRAM using pre-discharged bit lines includes holding a bit line associated with the memory cell at a zero voltage potential when the memory cell is not being accessed; energizing the bit line to a first voltage potential different than the zero voltage potential during an access of the memory cell; and sensing the memory cell contents when the associated bit line has reached the first voltage potential.

BRIEF DESCRIPTION OF THE DRAWINGS

Referring to the exemplary drawings wherein like elements are numbered alike in the several Figures.

DETAILED DESCRIPTION

Disclosed herein is an apparatus and method for low power sensing in a multi-port SRAM using pre-discharged bit lines. Briefly stated, the apparatus and method pre-charges the SRAM read port bit lines to a logic low level of zero volts (i.e., "pre-discharges" the bit lines). As a result, the read port bit lines of the multi-port SRAM do not leak DC current when pre-discharged as such. The apparatus and method holds the SRAM read port bit lines that are not being read at any particular point in time at ground (zero voltage) potential, and energizes selected read port bit lines (i.e., applies a potential thereto) only when the selected read port bit lines are accessed to read or sense the stored information within the selected memory cell. In addition, the potential applied to the selectively energized read bit lines is lower in value than the full rail voltage potential (typically +1 volts or Vdd); that is, the applied potential is at an intermediate value between Vdd and ground, thereby saving AC power due to relatively lower voltage swings on these lines.

Figure 1:
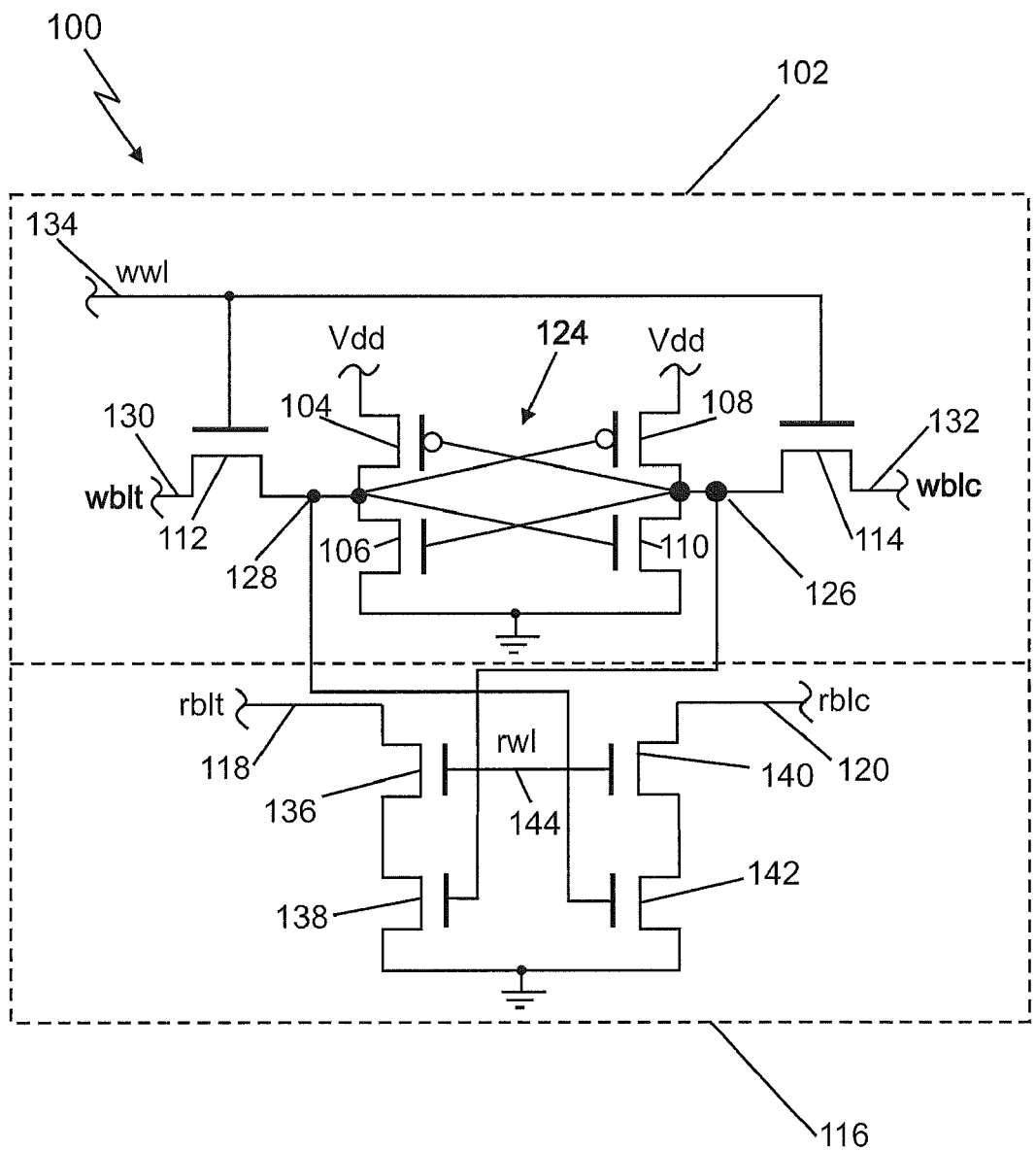
FIG. 1 is a schematic diagram of a multi-port SRAM cell.

Referring to FIG. 1, there is shown a typical multi-port (e.g., two port) SRAM memory cell 100. The cell 100 includes a base cell 102 that comprises six CMOS transistors 104-114, wherein the base cell 102 constitutes both the write port of the memory cell 100 and the basic storage element of the memory cell 100. FIG. 1 also shows a read port 116 in which both the true and complement read bit lines, rblt 118, rblc 120, are connected to a sense amp 122 (SA), shown in FIG. 2, for sensing the logic value stored in the cell 100. A plurality of the read ports 116 may be used as part of a single memory cell 100, if desired.

The base cell 102 of FIG. 1 includes a bistable latch 124 comprising a first pair of PMOS (e.g., PFET) and NMOS (e.g., NFET) transistors 104, 106 connected in series as an inverter between a positive power supply potential Vdd (e.g., +1 volts) and a ground potential (e.g., 0 volts). The latch 124 further comprises a second pair of PMOS and NMOS transistors 108, 110, also connected in series as an inverter between the power supply potential Vdd and ground. The transistors 104, 106 have their respective gate terminals connected together at a storage node 126, which is also connected to the drain terminals of both transistors 108, 110, which drain terminals are connected together. This storage node 126 is referred to as the "complement" node. Similarly, the transistors 108, 110 have their respective gate terminals connected together at a storage node 128, which is also connected to the drain terminals of both transistors 104, 106, which drain terminals are connected together. This storage node 128 is referred to as the "true" node. In normal operation of the base cell 102, the true storage node 128 and the complement storage node 126 typically store complementary logic levels (i.e., one node stores a binary "1" while the other node stores a binary "0", or vice versa). Thus, the PMOS transistors 104, 108 operate as load transistors and the NMOS transistors 106, 110 operate as drive transistors within the base cell 102.

The base cell 102 also includes two NMOS transistors 112, 114. A first transistor 112 is connected between a true write bit line, wblt 130, and the storage node 128. A second transistor 114 is connected between a complement write bit line, wblc 132, and the storage node 126. Gate terminals of these transistors 112, 114 are connected to a common write word line, wwl 134. As such, the transistors 112, 114 each have their respective gate potentials controlled by the write word line, wwl 134.

The read port 116 further includes four NMOS transistors 136-142. Two of the transistors 136, 138 are connected in series between the true read bit line, rblt 118, and ground. Another two of the transistors 140, 142 are connected in series between the complement read bit line, rblc 120, and ground. Gate terminals of two of the transistors 136, 140 are connected to a common read word line, rwl 144. As such, the transistors 136, 140 have their respective gate potentials controlled by the read word line, rwl 144. The gate of transistor 138 is connected to the complement storage node 126 in the base cell 102, while the gate of transistor 142 is connected to the true storage node 128 in the base cell 102. In general, the transistors 136-142 within the read port 116 do not necessarily need to be long channel or SRAM-type high voltage threshold devices. It suffices that these transistors 136-142 are such that any current leakage therethrough does not degrade the signal to a large enough extent to cause any read errors.

In operation of the base cell 102 and the read port 116, when the common write word line, wwl 134, is active, access to the cell for write or read operations is enabled. Thus, when wwl 134 is active, data may be written to the storage nodes 126, 128 via the two complementary write bit lines, wblt 130, wblc 132, respectively. When the common write word line, wwl 134, is inactive, the data previously written to the storage nodes 126, 128 is held steady by the latch 124 comprised of the transistors 104-110. When the common read word line, rwl 144, is active, data is read from the storage nodes 126, 128 via the two complementary read bit lines, rblt 118, rblc 120. In a typical SRAM memory cell 100, it is not necessary to periodically assert the common write word line 134 (i.e., apply a voltage thereto) to refresh the data held in the latch 124. The data will be held in a steady state in the latch 124 as long as power is continuously applied to the cell 100.

Figure 2:
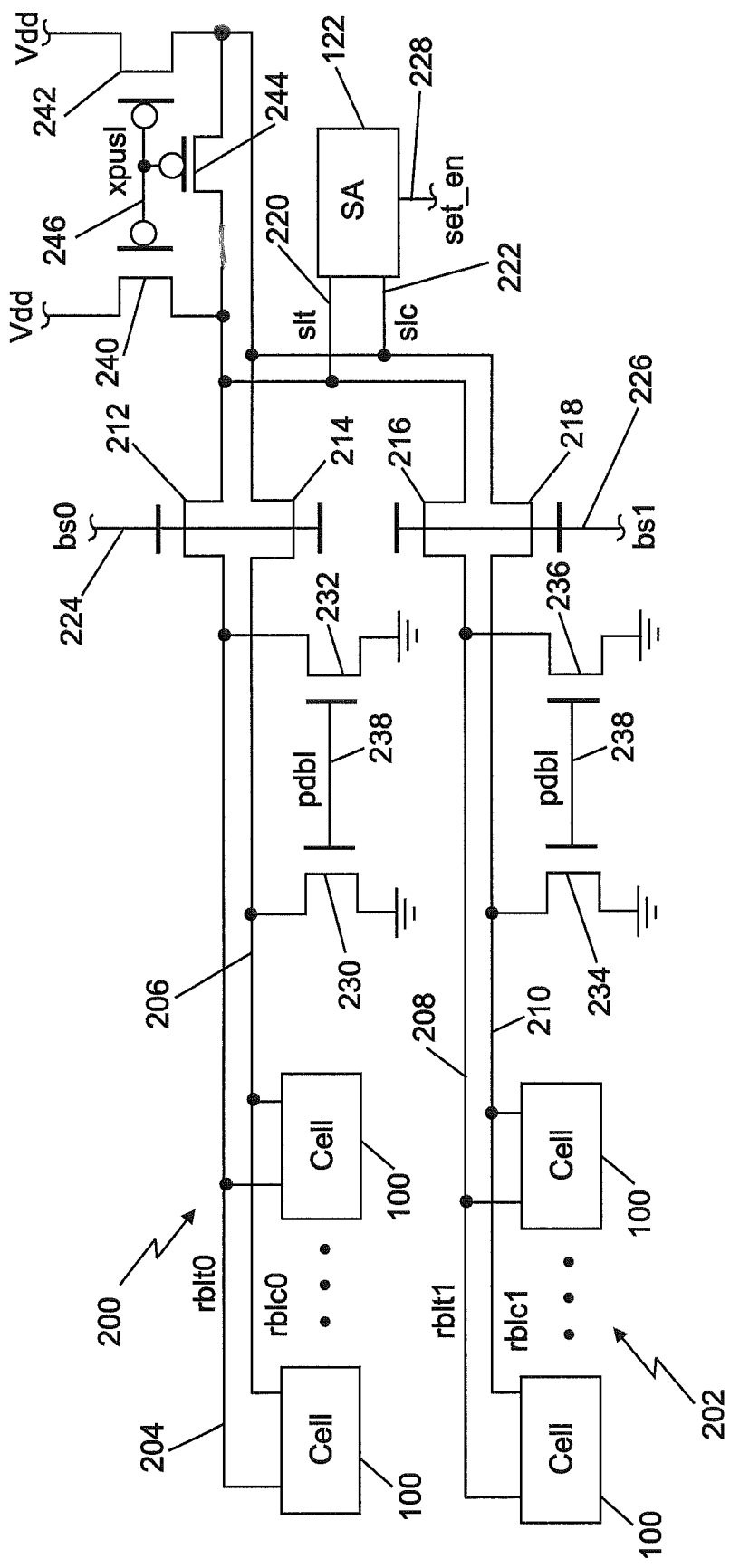
FIG. 2 is a schematic diagram of circuitry that includes the SRAM cell of FIG. 1 and illustrates an exemplary embodiment of the present invention.

FIG. 2 shows an exemplary embodiment of the present invention. In the multi-port SRAM, multiple rows 200, 202 of SRAM memory cells 100 (two rows 200, 202 are shown, each row having a plurality of cells 100) may each be connected to the sense amp 122. For each row 200, 202 of cells 100, the cells 100 are connected together by the respective read bit lines: rblt0 204 and rblc0 206 for row zero 200; rblt1 208 and rblc1 210 for row one 202. These read bit lines 204-210 are the read bit lines 118, 120 originating from the read port 116 in FIG. 1. Each read bit line 204-210 is connected to the sense amp 122 through a corresponding bit switch circuit, where each bit switch circuit is comprised of an NFET pass gate transistor 212-218, each having a relatively high voltage threshold. The true read bit lines 204, 208 of each row 200, 202 pass through the corresponding bit switch circuits 212, 216 and connect together as a true sense line, slt 220. Similarly, the complement read bit lines 206, 210 of each row 200, 202 pass through the corresponding bit switch circuits 214, 218 and connect together as a complement sense line, slc 222. The gate terminal of each bit switch circuit NFET transistor 212, 214 for row zero 200 is controlled (i.e., the NFET transistor is turned "on") by a positive active signal line, bs0 224. Similarly, the gate terminal of each bit switch circuit NFET transistor 216, 218 for row one 202 is controlled by a positive active signal line, bs1 226. The sense lines 220, 222 are provided to the sense amp 122, which is enabled by a sense signal line, set_en 228.

FIG. 2 also illustrates that, in accordance with the present invention, the apparatus further includes an NFET transistor 230-236 for a corresponding one of each of the read bit lines 204-210. The drain terminal of each NFET transistor 230-236 is connected to the corresponding read bit line 204-210, while the source terminal of each transistor 230-236 is connected to ground. The gate terminal of each transistor 230-236 is connected to a common positive active control signal line, pdbl 238. As described in detail hereinafter, when one or more of the transistors 230-236 are turned on, the corresponding read bit line 204-210 is pulled down to ground potential, thereby "pre-discharging" the corresponding read bit line 204-210, with the result being that no DC current leakage occurs on these lines 204-210 when pre-discharged as such.

In FIG. 2, the sense lines, slt 220 and slc 222, are also connected to a sense line pre-charge control circuit that comprises three PFET transistors 240-244. The gate terminals of all three transistors 240-244 are connected to a negative active sense line pre-charge signal, xpusl 246. When this signal, xpusl 246, turns on each of the transistors 240-244, the sense lines, slt 220 and slc 22, are pre-charged to a high logic level of Vdd (e.g., +1 volts).

Figure 3:
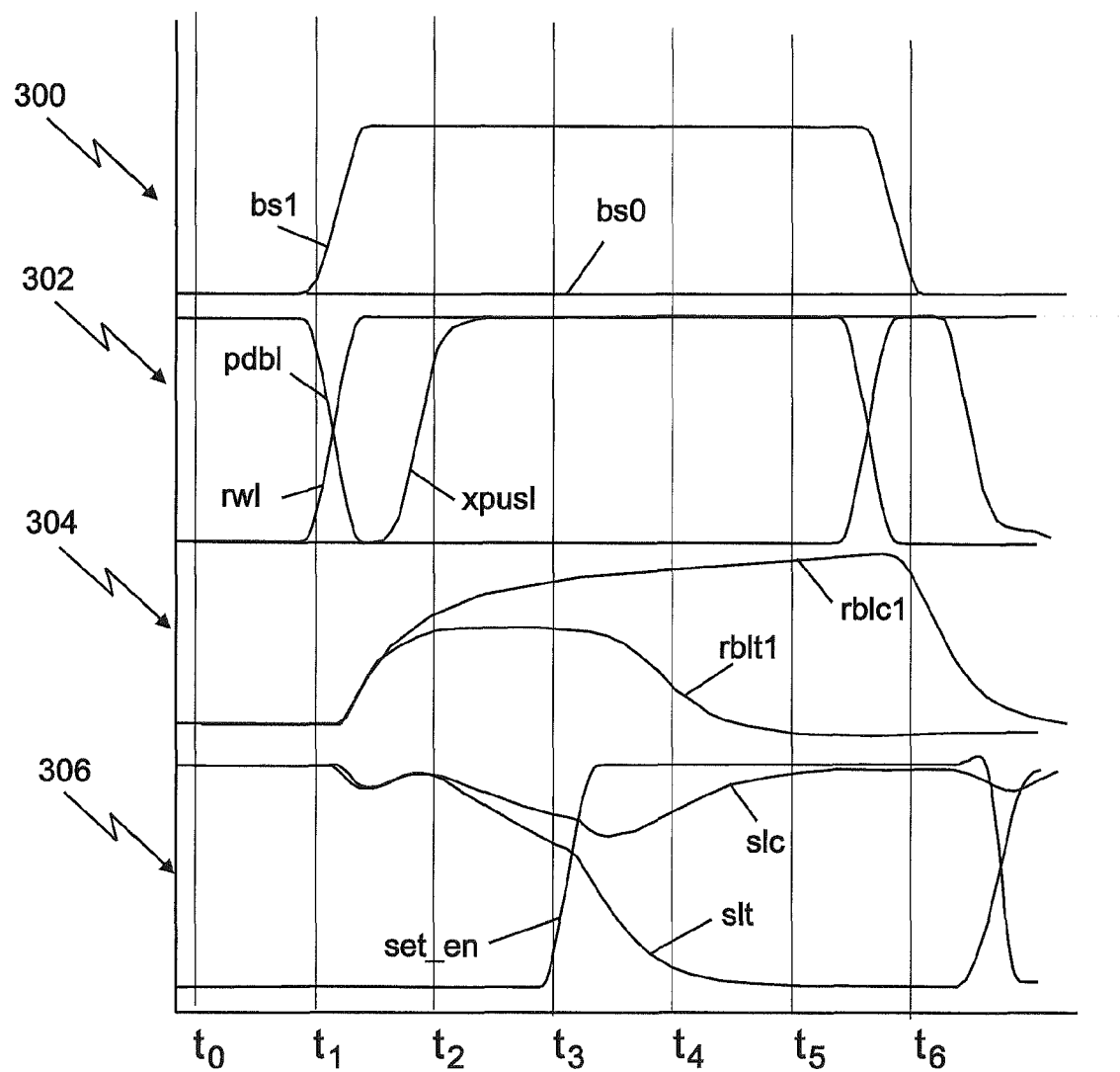
FIG. 3 shows several signal timing diagrams within the circuitry of FIG. 2.

In the apparatus of FIG. 2 in accordance with an exemplary embodiment of the present invention, the read bit lines 204-210 are pre-charged to a logic low level of, e.g., ground or zero volts ("pre-discharged"), through the NFET transistors 230-236, rather than to a logic high level of, e.g., Vdd or +1 volts, as in the prior art. Also, as compared to prior art dual-ended sensing apparatus and methods, the bit switch circuit transistors 212-218 now comprise relatively high threshold voltage (Vt) NFETS instead of PFETS. In addition, the polarity of the transistor controls signals (i.e., the gate voltage signals) agree with their respective transistor device-types, and the timing of the sense line pre-charge control signal, xpusl 246, has been changed, as illustrated in FIG. 3. These changes do not increase the area occupied by the SRAM memory cell 100. In fact, in practice it has been discovered that the area is reduced slightly.

When the read bit lines 204-210 are pre-discharged to a logic low level, no DC leakage occurs through the read ports 116 of the SRAM. A slight delay in reading out the stored data occurs because the read bit lines 204-210 are energized to an intermediate voltage level between Vdd and ground prior to their sensing or reading out of the stored values therefrom. This is done by keeping the sense line pre-charge control signal, xpusl 246, active for a short period of time after the word line, wwl 134, has been activated, as shown in FIG. 3. AC power is reduced because only selected ones of the bit lines 204-210 that are being read are energized at any particular point in time, and also because, even when energized, the selected bit lines 204-210 are not fully charged to Vdd but to a voltage that is intermediate between Vdd and ground.

Referring also to FIG. 3, there illustrated are several signal traces of voltage values versus time at different points in the circuit of FIG. 2. The respective bit switch control signals, bs0 224, bs1 226, are active high as shown in FIG. 2 and in the top trace 300. In the example shown, row 1 202 is activated because the pass gate transistor control signal, bs1 226, assumes a logic high value shortly after time t=1, thereby turning on NFETS 216, 218, while the pass gate transistor control signal, bs0 224, remains at a low logic level, thereby keeping NFETS 212, 214 off and not allowing the read bit signal lines, rblt0 204 and rblc0 206, to influence the sense lines, slt 220 and slc 222.

As shown in the next trace 302, the pre-discharge control signal, pdbl 238, for the NFETS 230-236 assumes a low logic level also shortly after time t=1, thereby turning off the NFETS 230-236 (i.e., removing the "pre-discharge" or zero volt state of the read bit lines 204-210). Also, shortly after time t=1, the common read word line, rwl 144, assumes a high logic level, thereby allowing access to the cell 100. The sense line pre-charge control signal, xpusl 246, stays at a logic low until approximately t=2, at which time it changes to a logic high, thereby turning off the PFETS 240-244. This delay between rwl 144 going high and xpusl 246 going high allows the selected read bit lines (here, rblt1 208 and rblc1 210) to become energized to a voltage value intermediate between Vdd and ground, as described hereinafter.

The next trace 304 shows the read bit lines for the selected row, row 1 202, in which the true read bit line, rblt1 208, and the complement read bit line, rblc1 210, are energized and start to increase in voltage beginning shortly after time t=1. The read lines will achieve a voltage value intermediate between Vdd (e.g., +1 volts and ground). This increase in voltage is due to the aforementioned delay between rwl 144 going high and then xpusl 246 going high. That is, the sense line pre-charge PFETS 240-244 remain turned on for a short time after rwl 144 is activated until xpusl 246 also goes high, which allows for charge-sharing from the sense lines, slt 220 and slc 222, to the bit lines rblt1 208 and rblt0 210, of the selected row 202. One of the bit lines, rblt1 208, will not rise in voltage as quickly as that of the other bit line, rblc1 210, due to the "0" state of the selected cell 100 in this exemplary embodiment.

The next trace 306 shows the sense lines, slt 220 and slc 222, and the set enable signal, set_en 228. As compared to the prior art, the set enable signal is delayed slightly in transitioning from logic low to logic high (at approximately time t=3) to account for the time it takes to energize the read bit lines 208, 210. Consequently this delays the sense line resolution, which is the time at which the sense line signal, slt 220, assumes a logic low (i.e., at approximately time t=4). Thereafter the logic bit values on the selected read bit lines can be sensed or read by the sense amp 122.

The apparatus and method of the present invention pre-charges the read port bit lines 204-210 to a logic low level when they are not being read or sensed so that the read ports 116 of the multi-port SRAM do not unnecessarily leak DC current. The bit lines 204-210 are held at ground and energized only when they are accessed, as shown in FIG. 3. Hence the read port DC leakage due to the SRAM cells is significantly reduced, as compared to prior art schemes that pre-charge the read bit lines to Vdd. There is a small amount of current leakage through the bit switch transistors 212-218. However, this amount of leakage is significantly less than that of the cells for all but the smallest SRAM sizes. In addition, the AC power is reduced because the bit lines 204-210 are not fully charged to a full voltage rail potential (e.g., of Vdd) when they are energized (as shown in FIG. 3), and also because only the bit lines 204-210 that are being read are energized. When the selected read bit lines 204-210 are energized, some current leakage occurs. However, because typically only a selected few, and not all, of the bit lines are energized at any one point in time, the overall amount of current leakage caused by the energized bit lines is significantly lower then in the prior art where all of the bit lines are typically pre-charged to Vdd.

The read performance is delayed slightly to allow the bit lines to energize to some intermediate voltage lower than Vdd prior to the read operation. The delay penalty is small, and depends on the technology voltage and temperature. For example, in a 65 nm CMOS bulk technology at a slow process corner and low voltage, the delay penalty is about 60 ps. At a 1 GHz cycle time, this would represent a 6% decrease in performance. With newer technologies, the write time of the cell limits the performance more than the read time, so delaying the read slightly may not affect overall performance at all. Implementation of the present invention requires no additional area over current multi-port SRAM designs and does not change the design structure of the sense amp 122.

The expected power savings brought about by the present invention depends on the memory configuration and the operating voltage. For example, at 1V in a 65 nm CMOS-bulk technology, a two-port array configured as 8 columns with 64 cells per column, a savings of approximately 654 nW per sense amp occurs. At a cycle time of 900 ps, the AC power savings are 2400 nW per sense amp. For an ASIC design employing 60 two-port SRAM macros, each with 2000 sense amps, then approximately 78 mW leakage and 0.29 W AC power per chip may be saved.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for sensing contents of a memory cell within a semiconductor memory, the method comprising:
    holding a bit line associated with the memory cell at a zero voltage potential when the memory cell is not being accessed;
    energizing the bit line to a first voltage potential different than the zero voltage potential during an access of the memory cell; and sensing the memory cell contents when the associated bit line has developed enough signal at the first voltage potential.

2. The method of claim 1, wherein the access of the memory cell is a read access of the memory cell.

3. The method of claim 1, wherein the first voltage potential comprises a voltage value greater than zero volts and less than a voltage rail potential utilized by the memory cell.

4. The method of claim 1, further comprising pre-charging a sense line to a second voltage potential prior to the step of energizing the bit line to the first voltage potential.

5. The method of claim 4, wherein energizing the bit line to a first voltage potential different than the zero voltage potential during an access of the memory cell comprises sharing of charge between the pre-charged sense line and the bit line.

6. A method for reading a value in a memory cell, the method comprising:
holding a bit line associated with the memory cell at a zero voltage potential when the memory cell is not being accessed;
energizing the bit line to a first voltage potential different than the zero voltage potential during a read access of the memory cell; and
reading the memory cell contents on the bit line during the read access of the memory cell.

7. The method of claim 6, wherein the first voltage potential comprises a voltage value greater than zero volts and less than a voltage rail potential utilized by the memory cell.

8. The method of claim 6, further comprising pre-charging a sense line to a second voltage potential prior to the step of energizing the bit line to the first voltage potential.

9. The method of claim 8, wherein energizing the bit line to a first voltage potential different than the zero voltage potential during a read access of the memory cell comprises sharing of charge between the pre-charged sense line and the bit line.

10. The method of claim 6, wherein energizing the bit line to a first voltage potential different than the zero voltage potential during a read access of the memory cell comprises selectively connecting the bit line with the sense line.

* * * * *